(12) United States Patent
Nakamura et al.

(10) Patent No.: US 9,565,776 B2
(45) Date of Patent: Feb. 7, 2017

(54) METHOD FOR TREATING SUBSTRATE THAT SUPPORT CATALYST PARTICLES FOR PLATING PROCESSING

(71) Applicants: Tanaka Kikinzoku Kogyo K.K., Chiyoda-ku (JP); A School Corporation Kansai University, Osaka (JP)

(72) Inventors: Noriaki Nakamura, Tsukuba (JP); Junichi Taniuchi, Tsukuba (JP); Hitoshi Kubo, Tsukuba (JP); Yuusuke Ohshima, Tsukuba (JP); Tomoko Ishikawa, Tsukuba (JP); Shoso Shingubara, Tsukuba (JP); Fumihiro Inoue, Tsukuba (JP)

(73) Assignee: Tanaka Kikinzoku Kogyo K.K., Tokyo (JP)

( * ) Notice: Subject to any disclaimer, the term of this patent is extended or adjusted under 35 U.S.C. 154(b) by 0 days.

(21) Appl. No.: 14/429,702

(22) PCT Filed: Sep. 27, 2013

(86) PCT No.: PCT/JP2013/076285
§ 371 (c)(1),
(2) Date: Mar. 19, 2015

(87) PCT Pub. No.: WO2014/051061
PCT Pub. Date: Apr. 3, 2014

(65) Prior Publication Data
US 2015/0237742 A1 Aug. 20, 2015

(30) Foreign Application Priority Data
Sep. 28, 2012 (JP) .................. 2012-216580

(51) Int. Cl.
*B05D 5/12* (2006.01)
*H05K 3/42* (2006.01)
*H05K 3/38* (2006.01)

(52) U.S. Cl.
CPC .............. *H05K 3/422* (2013.01); *H05K 3/387* (2013.01); *H05K 3/389* (2013.01); *H05K 3/426* (2013.01)

(58) Field of Classification Search
None
See application file for complete search history.

(56) References Cited

U.S. PATENT DOCUMENTS

| 3,684,534 | A | 8/1972 | Emerson | |
|---|---|---|---|---|
| 5,264,288 | A | 11/1993 | Das et al. | |
| 2004/0089948 | A1* | 5/2004 | Cheng | H01L 21/486 257/758 |
| 2005/0120550 | A1 | 6/2005 | Cheng et al. | |
| 2010/0075026 | A1 | 3/2010 | Sung et al. | |
| 2010/0323111 | A1* | 12/2010 | Gong | C23C 18/30 427/314 |
| 2011/0088933 | A1* | 4/2011 | Amou | H05K 3/385 174/257 |
| 2011/0168430 | A1* | 7/2011 | Hata | H05K 3/389 174/126.1 |
| 2012/0097548 | A1* | 4/2012 | Liu | C23C 18/28 205/187 |
| 2015/0303103 | A1* | 10/2015 | Shinguhara | C23C 18/1608 438/675 |

FOREIGN PATENT DOCUMENTS

| EP | 2476723 A1 | 7/2012 |
|---|---|---|
| JP | 2000-087248 A | 3/2000 |
| JP | 2007-084850 A | 4/2007 |
| JP | 2011-044524 A | 3/2011 |
| JP | 2011-197510 * | 9/2012 |
| WO | WO 2004/037410 A1 | 5/2004 |

OTHER PUBLICATIONS

PCT, International Search Report PCT/JP2013/076285, Oct. 22, 2013.
European Extended Search Report, Application No. 14904905.8, Sep. 22, 2016.

* cited by examiner

*Primary Examiner* — Austin Murata
(74) *Attorney, Agent, or Firm* — Orrick Herrington & Sutcliffe, LLP

(57) ABSTRACT

The present invention provides a method for treating a substrate that supports metal fine particles for forming a plating layer on a circuit pattern or TSVs in various substrates, in which further micronization treatment is enabled compared with the conventional methods, and the formation of a stable plating layer is enabled. The present invention is a method for treating a substrate, the method including bringing a substrate into contact with a colloidal solution containing metal particles in order to support the metal particles that serve as a catalyst for forming a plating layer on the substrate, in which the colloidal solution contains metal particles formed of Pd and having a particle size of 0.6 nm to 4.0 nm and a face-to-face dimension of the (111) plane of 2.254 Å or more. When an organic layer such as SAM is formed on a surface of the substrate before this treatment, the binding force of the Pd particles can be increased.

19 Claims, 4 Drawing Sheets

TEM IMAGE

METHOD FOR TREATING SUBSTRATE THAT SUPPORT CATALYST PARTICLES FOR PLATING PROCESSING

TECHNICAL FIELD

The present invention relates to a treatment method usable when a metal layer such as a barrier layer or an electrode layer is formed by plating on a substrate such as an LSI substrate. More particularly, the invention relates to a treatment method of supporting, on a substrate, metal particles that act as a catalyst for forming a plating layer on the substrate.

BACKGROUND ART

In the processes for producing printed boards, LSI substrates and the like that are mounted in various electronic devices, electroconductive metal layers that constitute wirings, electrodes and the like are formed. These electroconductive metal layers have been conventionally formed by using combinations of thin metal film forming processes based on physical deposition methods such as a vapor deposition method and a sputtering method, or chemical deposition methods such as a CVD method, and patterning processes such as photolithography and etching.

Furthermore, along with the higher density of electronic devices in recent years, the number of exemplary applications of multilayer LSI substrates and 3D-ICs that use TSVs (through-silicon vias) is ever increasing. The TSVs used in these are formed by sequentially laminating a barrier layer, a seed layer, and a filling material layer over through-holes (via holes) provided in a substrate. At this time, a physical deposition method or a chemical deposition method is applied to the formation of the various metal layers as well.

However, in the thin metal film forming process described above, physical deposition methods have a problem of poor step coverage, in addition to the necessity of large-sized vacuum apparatuses. The problem of step coverage becomes an obstacle particularly to the application to TSVs. On the other hand, in view of chemical deposition methods, there is a problem that the metal compounds used as raw materials are expensive, and there is a concern about an increase in the thin film production cost since the processes themselves are highly expensive and require high temperatures. Furthermore, although chemical deposition methods exhibit satisfactory step coverage when compared with physical deposition methods, it is difficult in many cases to perform uniform film formation over the bottoms of via holes having high aspect ratios.

Thus, investigations have been conducted on the utilization of a plating method as a method of forming a high quality metal film at low cost. Particularly, more attention is paid to electroless plating, which is a technique intended for producing micronized and complicated metal wirings and is also capable of coping with precision processed products. For example, Patent Document 1 discloses a method of attaching metal catalyst particles of Ag and Pd to a substrate, and performing electroless plating by using these catalyst particles as the nuclei for plating. This method is also applicable to a TSV substrate embedding process.

Furthermore, Patent Document 2 discloses a method of using precious metal particles as catalyst particles for circuit pattern formation. In this method, a predetermined compound is applied on a substrate prior to the adsorption of precious metal particles, thereby a self-assembled monolayer (hereinafter, may be referred to as SAM) is formed, and precious metal fine particles are adsorbed thereon. The SAM is applied in order to adsorb precious metal fine particles at desired locations in a desired pattern on the substrate, and to also maintain a stable adsorption state.

RELATED ART DOCUMENT

Patent Documents

Patent Document 1: JP 2000-087248 A
Patent Document 2: JP 2007-84850 A

SUMMARY OF THE INVENTION

Problems to be Solved by the Invention

The conventional art of supporting metal fine particles on a substrate and forming a plating layer by using these fine particles as a catalyst as described above has been already established; however, the progress of complication and micronization of circuit patterns or TSVs in various substrates continues without stopping, and there is a concern about the extent of how far measures can be taken against the conventional methods in view of the complication and micronization. Thus, the present invention provides a method for treating a substrate that supports metal fine particles as a catalyst for forming a plating layer on a substrate, the method enabling a further micronization treatment than the conventional level, and enabling formation of a stable plating layer.

Means for Solving the Problems

The present invention to achieve the above object is a method for treating a substrate, the method including bringing a substrate into contact with a colloidal solution containing metal particles in order to support the metal particles that serve as a catalyst for forming a plating layer on the substrate, wherein the colloidal solution contains metal particles formed of Pd and having a particle size of 0.6 nm to 4.0 nm and a face-to-face dimension of the (111) plane of 2.254 Å or more.

The present invention employs Pd as a constituent metal for the metal fine particles that serve as a catalyst for forming a plating layer, and the particle size thereof is set to 0.6 nm to 4.0 nm. Pd is selected because even if Pd is supported on Si that is usually used in substrates ($SiO_2$ is formed on the surface), the problem of diffusion does not occur. From this point of view, Au fine particles may be expected to have catalytic action for plating layers, but the problem of diffusion between the Au fine particles and $SiO_2$ occurs. Furthermore, the particle size of the Pd particles is set to 0.6 nm to 4.0 nm because when the Pd particles as catalyst particles are made fine, a suitable distribution state can be manifested. It is also because since the catalytic action becomes stronger, the plating layer obtained thereafter becomes uniform and strong.

Furthermore, in the present invention, it is also an essential condition to apply Pd particles having a face-to-face dimension of the (111) plane of Pd of 2.254 Å or more. In regard to this face-to-face dimension, the general face-to-face dimension of the (111) plane of Pd is 2.249 Å to 2.244 Å. That is, the present invention involves shifting the face-to-face dimension of the (111) plane of Pd to the longer dimension side. Pd particles having the face-to-face dimension in this range act as nuclei having high catalytic activity, and can enhance the adhesiveness of the plating layer formed thereafter. Furthermore, when the face-to-face dimension is suitably adjusted, even if the film thickness of the plating layer is set to a relatively thin range, a continuous film can be formed. Thereby, a plating processing of fine via holes having a high aspect ratio is also enabled. In regard to this face-to-face dimension of the (111) plane of the Pd particles, it is preferable to set the upper limit to 2.388 Å while considering the adjustable range.

Furthermore, the particle size of the Pd particles can be measured by directly measuring with electron microscopic images (TEM and SEM), or by measuring the full width at half maximum of the diffraction line obtained by an X-ray diffraction analysis and calculating the particle size by Scherrer equation. Furthermore, the face-to-face dimension of the (111) plane of the Pd particles can be measured by calculating from the peak position obtained by an X-ray diffraction analysis, by Bragg equation, and can also be measured by an extended X-ray absorption fine structure (EXAFS) analysis.

As described above, the treatment of supporting Pd particles according to the present invention is carried out with a colloidal solution containing Pd particles. Here, for the solvent of the colloidal solution, water and organic solvents such as alcohols can be applied. Furthermore, the Pd particles may be bound with a protective agent for the purpose of preventing aggregation of the particles. Preferred examples of the protective agent include polyvinylpyrrolidone (PVP), polyethyleneimine (PEI), polyacrylic acid (PAA), tetramethylammonium (TMA), and citric acid. However, application of the protective agent is not necessarily essential.

The contacting treatment between a metal colloidal solution and a substrate is preferably carried out by immersing the substrate in the metal colloidal solution. Regarding the conditions at this time, it is preferable to set the immersion time to 1 minute to 60 minutes. Furthermore, the temperature of the metal colloidal solution is preferably 5° C. to 80° C. The substrate obtained after the immersion in the metal colloidal solution may be subjected to a drying treatment; however, as described above, a substrate having a SAM formed thereon in advance can be directly subjected to a plating processing.

Regarding the number of Pd particles to be supported on the substrate by the contacting treatment between the metal colloidal solution and the substrate, it is preferable to set to a target range of $4.0 \times 10^3$ to $1.0 \times 10^5$ particles/m². Then, in order to support the Pd particles in this range, it is preferable to adjust the concentration of the metal particles in the colloidal solution to $9.3 \times 10^{-6}$ to $3.8 \times 10^{-1}$ mol/L.

In the method for treating a substrate related to the present invention, Pd particles are supported on a substrate by bringing the colloidal solution containing Pd particles as explained above into contact with the substrate; however, it is also acceptable to use a substrate having appropriate organic layers formed thereon. These organic layers can increase the binding force between the Pd particles and the substrate. Thereby, it is made possible to rapidly perform the transfer from the Pd particle supporting process, which is a wet processing, to the plating process, which is similarly a wet processing.

The organic layer is an organic compound film having adsorption capacity to Pd particles, and first, a suitable example thereof is a self-assembled monolayer (SAM). Specific examples of the SAM include a SAM using a silane coupling agent, and it is preferable to use silane coupling agents having, for example, an amino group, a mercapto group, a sulfide group, a chloro group, a carbonyl group, and a carboxyl group at the ends. Examples of the silane coupling agent include 3-aminopropyltriethoxysilane, 3-aminopropyltrimethoxysilane, N-2-(aminoethyl)-3-amiopropyltriethoxysilane, and 3-mercaptopropyltrimethoxysilane.

Furthermore, as an organic layer other than the SAM, organic substances such as PI (polyimide), PET (polyethylene terephthalate), and PEN (polyethylene naphthalate) can also be applied. The functional groups such as a carboxyl group and an amino group that are present on the surface of these organic substances can be effectively adsorbed and bound to Pd particles, similarly to the SAM. Organic layers formed from these organic substances can be formed on the surface of an organic substrate by vapor deposition or the like. Furthermore, as the organic layer, it is also acceptable to form an organic layer having a bilayer structure in which an organic layer formed from the organic substances described above on the substrate surface, and a SAM is formed thereon.

However, it is not essential to form an organic layer on the substrate. The present invention can also be applied to conventional inorganic substrates such as a Si wafer. For example, when an organic substance substrate such as a PI substrate, a PET substrate or a PEN substrate is applied as a substrate, even if an organic layer is absent, binding between the organic substance substrate and Pd particles can be expected due to the functional groups at the substrate surface. In the case of using an organic substance substrate, the number of functional groups on the surface can be increased by modifying the surface with steam or the like before the substrate is used.

In the present invention, there are no particular limitations on the shape of the substrate to be treated, and the present invention is also applicable to a planar substrate. At this time, a metal layer having an arbitrary pattern can be formed by subjecting a substrate appropriately provided with a masking or a SAM to immersion in a metal colloidal solution, and plating this substrate.

However, the present invention is particularly useful because of the substrate in which via holes for forming a TSV electrode are formed. In the present invention that is capable of forming a fine Pd particle layer having excellent adhesiveness, a uniform and smooth thin metal film can be easily formed on a substrate in which a large number of fine via holes are formed, which process has been conventionally difficult. The present invention is particularly effective for via holes having a high aspect ratio, and for example, the present invention is also applicable to the filling of via holes having an aspect ratio of 3 to 50.

Furthermore, in regard to the plating processing that is carried out after the substrate treatment process related to the present invention, the plating processing can be arbitrarily selected depending on the composition of the thin metal film thus formed, or the like, and there are no particular limitations. For example, for a TSV electrode, a barrier layer is formed inside the via holes. Regarding the metal that constitutes the barrier layer, Co—B, Ni—B, Co—W—B, Ni—W—B, Co—P, Ni—P, Co—W—P, Ni—W—P and the like are applied. A barrier layer can be formed by an electroless plating processing of these metals.

The metal colloidal solution used in the treatment process related to the present invention can be produced by producing Pd particles having the above-described particle size and face-to-face dimension of the (111) plane, and dispersing these particles in a solvent. The basic production process for these Pd particles is equivalent to a known production process for a Pd colloid. That is, Pd particles are formed by mixing a solution of a Pd salt with a reducing agent and optionally a protective agent, and reducing the Pd ions in the Pd salt solution.

However, according to the present invention, it is necessary to micronize the particle size of the Pd particles, and to appropriately control the face-to-face dimension of the (111) plane as well. Therefore, in the present invention, special consideration is needed in the stage of preparing the Pd salt solution. More particularly, first, solid (powdered) Pd chloride ($PdCl_2$) is used as a precursor (raw material) of the Pd salt. Then, Pd chloride is introduced into water, and a chloride is added thereto. Pd chloride does not directly dissolve in water; however, when chloride ions are added, Pd dissolves in water and exists as Pd ions (exists as $[PdCl_4]^{2-}$ in the solution) that serve as the nuclei for Pd particles. This phenomenon itself is known; however, in the present invention, a Pd salt solution containing Pd ions in a preferable state is produced by utilizing this characteristic, and also by means of optimization of the chloride to be added and adjustment of the molar ratio between Pd atoms and chloride ions.

Here, preferred examples of the chloride that is added to the Pd chloride-containing solution include NaCl, KCl, $CaCl_2$, and $MgCl_2$ ($MgCl_2.6H_2O$). According to the present inventors, it is preferable that there be no fluctuation in the hydrogen ion concentration of the solution during the process of producing of Pd ions that follows dissolution of Pd chloride. The chlorides described above are capable of dissolving Pd chloride without increasing the hydrogen ion concentration, and thus Pd ions can be produced in a suitable state. Furthermore, it is preferable that the molar ratio between Pd atoms and chloride ions that is employed at the time of adding the chlorides, be adjusted to 2 to 5 mol of chloride ions relative to 1 mol of Pd atoms. Adjustment of this molar ratio between Pd atoms and chloride ions is also required for stable production of Pd ions.

When a reducing agent is added to the Pd salt solution produced as described above, Pd ions are reduced, and Pd particles are produced. An alcohol, sodium borohydride, dimethylamineborane or the like can be used as this reducing agent, but an alcohol is preferred. It is because the particle size of the Pd particles can be adjusted by the reduction temperature, and this particle size control can be easily achieved when an alcohol is used as a reducing agent. Furthermore, the reduction temperature is preferably set to 60° C. to 140° C.

The reaction liquid containing the Pd particles that have been synthesized by reduction may be appropriately subjected to filtration and concentration, and thus Pd particles can be recovered. Here, since Pd chloride is used in the present invention as described above, chloride ions as the counter ions of Pd remain in the form of ion or salt in the colloidal solution thus synthesized. It is preferable to eliminate these chloride ions because the chloride ions become impurities in the colloidal solution. Examples of the method for eliminating these ions include ultrafiltration and centrifugation. The optimum chloride ion concentration for the Pd particles that can be used to prepare the colloidal solution is 1.7 to 3.5 mol % with respect to Pd. However, it is not necessary to remove all the salt included in the Pd particles obtained after reduction, and the salt remained in an appropriate amount may even increase the stability of the colloid when produced into a solution. The concentration range described above is set in consideration of this factor.

The collected Pd particles can be produced into a Pd colloidal solution for substrate treatment by diluting the Pd particles with an appropriate solvent such as water (pure water). The suitable concentration of the Pd particles described above can also be easily adjusted by means of the amount of the solvent. Furthermore, at the time of adjusting this Pd colloidal solution, a salt may be added thereto in order to adjust the stability of the colloid.

Advantageous Effects of the Invention

As discussed above, the present invention is a method for treating a substrate that supports catalyst particles for plating processing on the substrate by means of a suitable metal colloidal solution containing Pd particles. According to the present invention, Pd particles having high catalytic activity can be suitably dispersed, and the adhesiveness of the plating layer formed thereafter can be improved.

DESCRIPTION OF EMBODIMENTS

Hereinafter, suitable embodiments of the present invention are described.

First Embodiment

In the present embodiment, Pd particles and a metal colloidal solution were produced, a substrate having TSVs formed therein was treated by immersing the substrate in this metal colloidal solution, and a plating layer was formed by electroless plating.

[Production of Pd Particles]

1500 mL of pure water was introduced into a separable flask having a capacity of 5 L, and 5.87 g of a Pd chloride powder (Pd content: 32.89 mmol) was introduced into this flask. The Pd chloride at this time is insoluble in water, and the solution is in a turbid state. While a sodium chloride solution obtained by dissolving 9.61 g of sodium chloride (5 times the molar equivalent of Pd) in 1000 mL of pure water was added to this solution, the mixture was stirred. During this operation, the solution acquired transparency and turned brown, and after stirring for 50 minutes, an orange-colored transparent aqueous solution was obtained.

An aqueous solution of PVP (obtained by dissolving 10.5 g of PVP in 1000 mL of pure water) was added to this aqueous solution of Pd chloride, and 875 mL of ethanol was further added thereto as a reducing agent. Then, the reaction liquid was stirred in a constant temperature tank at 110° C., and the reaction liquid was heated to reflux for 3 hours at 90° C.

The reaction liquid after reduction was cooled, subsequently filtered, and concentration in a rotary evaporator, and thus ethanol was removed. The residue was subjected to filtration and ultrafiltration. A filter having a fractionation molecular weight of 10,000 was used for the ultrafiltration. Thereafter, the filtrate was filtered again, and thus Pd particles were collected. These Pd particles were observed with TEM (transmission electron microscopy), and the particle sizes were measured. Also, measurement of the face-to-face dimension of the (111) plane of Pd was carried out by X-ray diffraction (source of radiation: CuKα radiation).

Figure 1A:
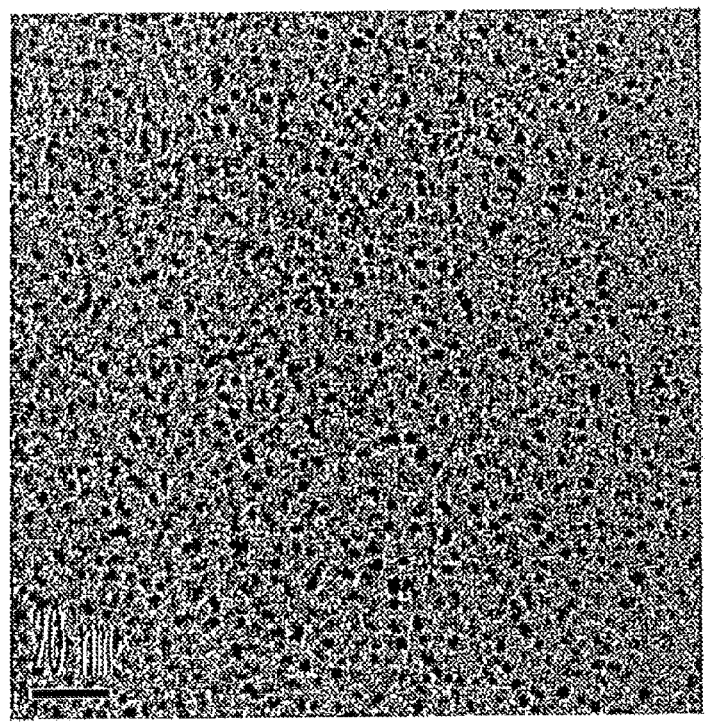
FIGS. 1(a) and 1(b) illustrate a TEM observation image and the results for an X-ray diffraction analysis of the Pd particles of a first embodiment.
Figure 1B:
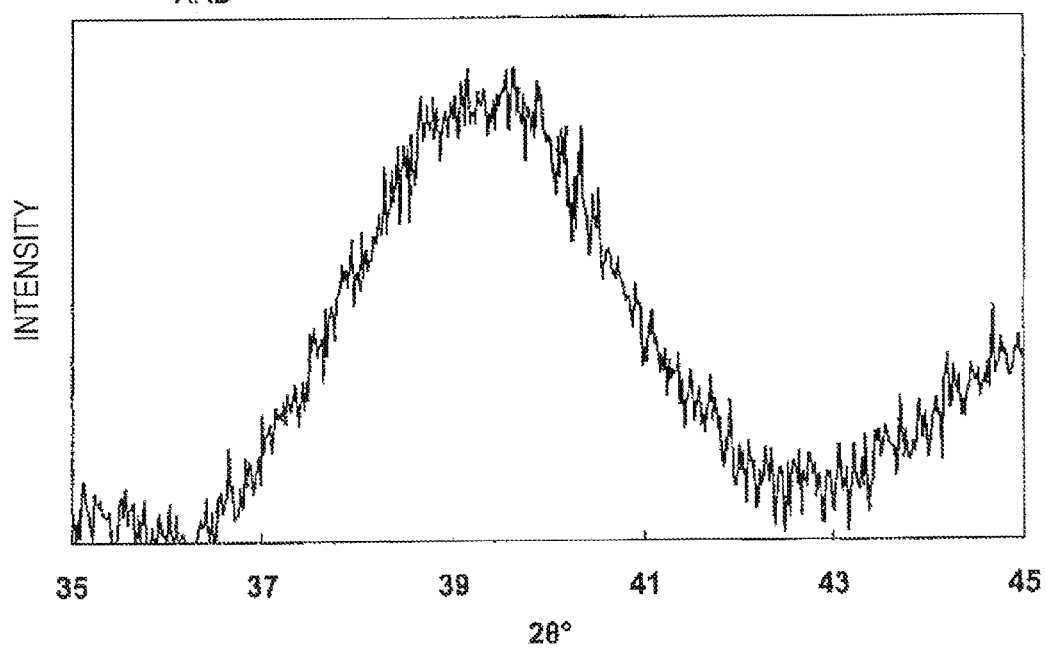

FIGS. 1(a) and 1(b) show a TEM image (FIG. 1(a)) of Pd particles, and a diffraction line of X-ray diffraction (2θ: 35° to 45°, FIG. 1(b)). The average particle size of the Pd particles obtained from the measurement based on the TEM image was 2.2 nm. Furthermore, the face-to-face dimension of the (111) plane calculated from the peak positions of the diffraction line of X-ray diffraction was 2.293 Å.

[Production of Pd Colloidal Solution]

The Pd particles collected as described above were diluted with pure water to obtain a Pd colloidal solution. The Pd concentration of the Pd colloidal solution was adjusted to 0.1 wt %.

[Substrate]

In the present embodiment, a Si substrate having a thickness of 100 μm was used. This substrate had via holes (hole diameter: 2 μm, depth: 30 μm; aspect ratio: 15) formed by reactive etching according to the Bosch process. This substrate had a $SiO_2$ layer (200 nm) formed by thermal oxidation after the formation of via holes. Also, the substrate was subjected to washing and degreasing before a SAM was formed thereon.

[SAM Formation]

The aforementioned substrate was immersed in a 3-aminopropyltriethoxysilane solution (solvent: toluene), and a SAM was formed thereon. This treatment was carried out for 1 hour at 60° C. After this silane coupling treatment, the substrate was washed with ethanol and further subjected to a calcination treatment for 1 hour at 110° C. Thus, the SAM was activated.

[Substrate Treatment by Means of Pd Colloidal Solution]

The substrate having a SAM formed thereon was immersed in the Pd colloidal solution produced as described above. The treatment temperature at this time was adjusted to 25° C., and the immersion time was set to 10 minutes. Through this treatment, the Pd particles bind to the amino groups at the ends of the SAM.

Figure 2:
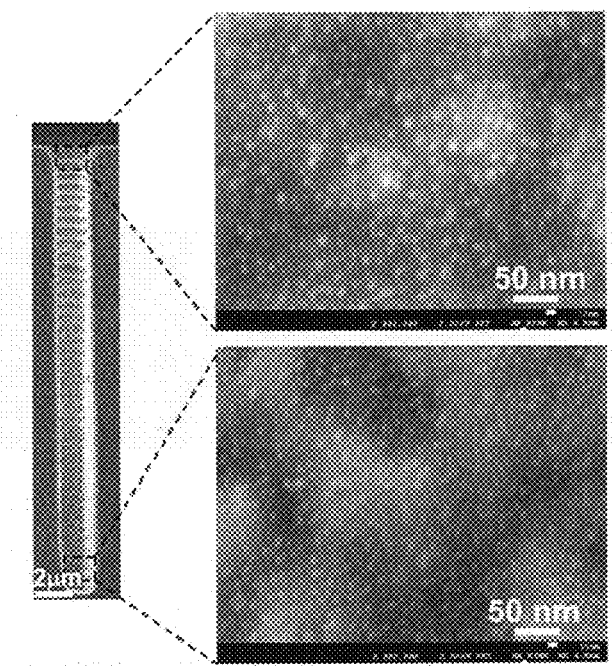
FIG. 2 is a photograph of the cross-section of a substrate via hole obtained after the supporting of the Pd particles according to the first embodiment.

FIG. 2 is a photograph of the cross-section of a substrate via hole obtained after the supporting of the Pd particles. It can be confirmed from FIG. 2 that the Pd particles are supported evenly at the opening and the bottom of the via hole. Furthermore, the number of Pd particles bound onto the substrate was calculated from the SEM photograph, and the number was $2.0 \times 10^4$ particles/m².

[Formation of Metal Film by Electroless Plating]

A Ni—B film was formed by electroless plating on the substrate obtained after the supporting of the Pd particles. For the Ni—B plating, an electroless plating liquid composed of 0.17 mol/L of nickel sulfate, 0.049 mol/L of dimethylaminoborane, and 0.63 mol/L of citric acid (reducing agent, complexing agent) was used. The electroless plating processing was carried out by immersing the substrate in the electroless plating liquid that had been adjusted to 70° C., for 1 hour.

Figure 3:
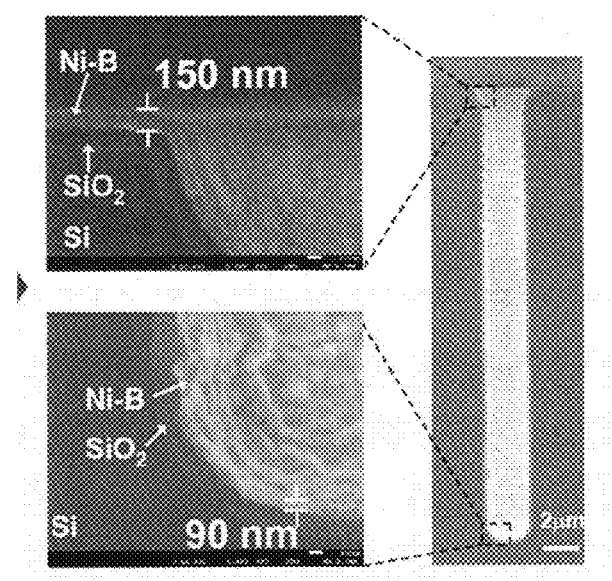
FIG. 3 is a photograph of the cross-section of a substrate via hole obtained after a Ni—B electroless plating processing according to the first embodiment.

FIG. 3 is a photograph of the cross-section of a substrate via hole obtained after a Ni—B electroless plating processing. It can be confirmed from FIG. 3 that the Pd particles supported at a high density act as a catalyst, and thus a thin and continuous Ni—B thin film is formed. Also, it can be seen that the Ni—B thin film is formed to a sufficient thickness even at the bottom of the via hole.

Second Embodiment

Here, the same treatment of a substrate as in the first embodiment was carried out by means of the Pd colloidal solution produced in the first embodiment, and the binding state of the Pd particles was checked in more detail. Also, a Co—W—B film was formed as a metal film by electroless plating.

The substrate used was a Si substrate having via holes (hole diameter: 2.5 μm, depth: 63 μm; aspect ratio: 25) formed therein. This substrate had a $SiO_2$ layer and a SAM formed in advance, as in the case of the first embodiment. This substrate was immersed in the Pd colloidal solution. The treatment temperature at this time was adjusted to 25° C., and the immersion time was set to 10 minutes.

Figure 4:
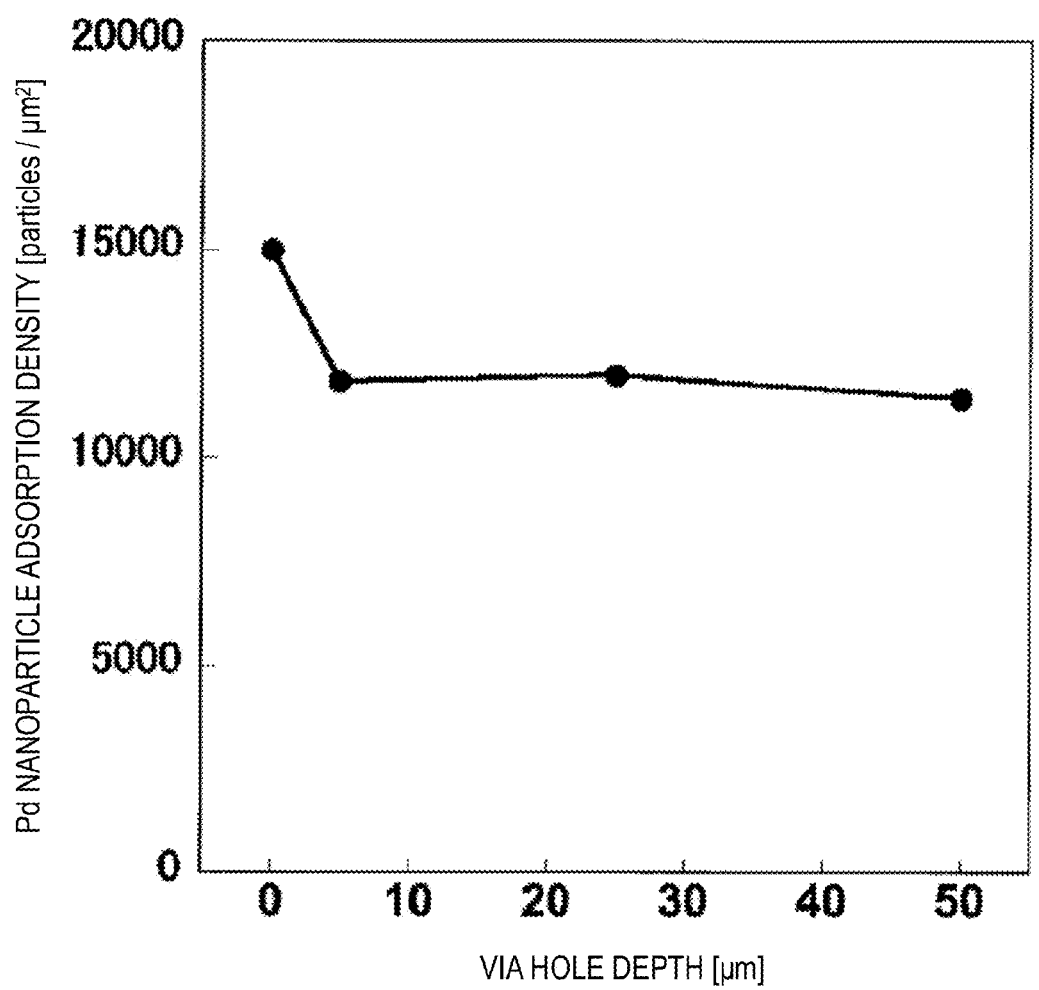
FIG. 4 is a diagram illustrating the Pd particle adsorption density on the substrate surface and on the inner walls of the via holes according to a second embodiment.

After the supporting of Pd particles by this immersion treatment, the Pd particle adsorption density (number of particles bound) on the substrate surface and the inner walls of the via holes was calculated from SEM photographs. The results are presented in FIG. 4. It can be confirmed from FIG. 4 that Pd particles are supported at a uniform density to the interior of the via holes by the Pd colloidal solution of the first embodiment.

Next, a Co—W—B film was formed by electroless plating on the substrate obtained after the supporting of the Pd particles. Co—W—B plating was carried out by means of an electroless plating liquid composed of 0.17 mol/L of cobalt sulfate, 0.049 mol/L of dimethylaminoborane, 0.005 mol/L of tungstic acid, and 0.63 mol/L of citric acid (reducing agent, complexing agent). The electroless plating processing was carried out by immersing the substrate in the electroless plating liquid that had been adjusted to 45° C., for 15 minutes.

Figure 5:
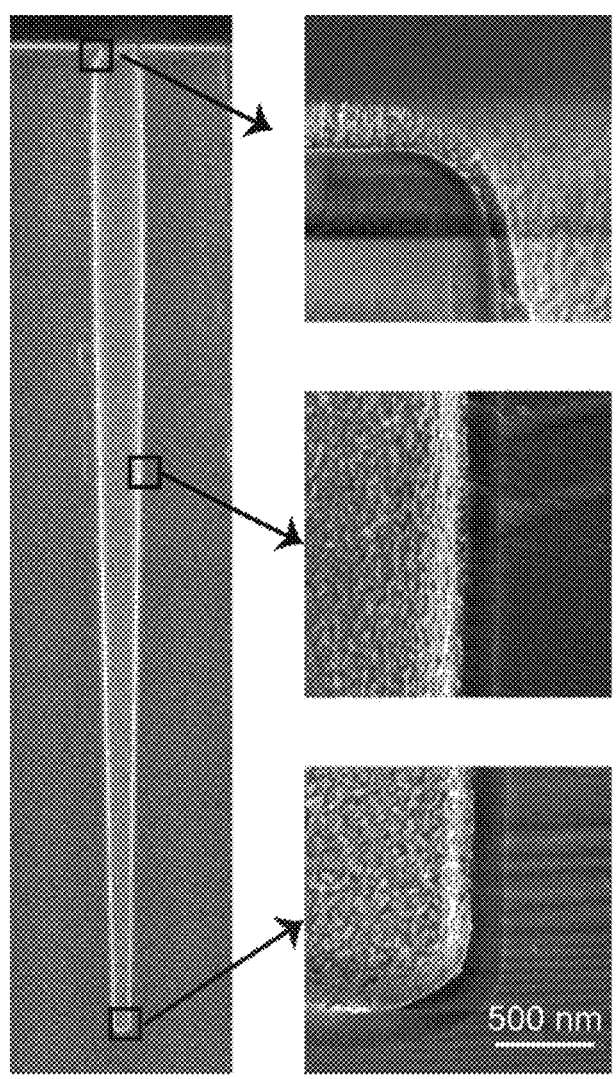
FIG. 5 is a photograph of the cross-section of a substrate via hole obtained after a Co—W—B electroless plating processing according to the second embodiment.

FIG. 5 is a photograph of the cross-section of a substrate via hole obtained after an electroless plating processing. It can be confirmed from FIG. 5 that a continuous thin metal film has also been formed by Co—W—B plating.

Third Embodiment

Here, Pd particles having different particle sizes and the face-to-face dimensions of the (111) plane of Pd were produced. 2000 mL of pure water was introduced into a separable flask, and 5.87 g of a Pd chloride powder (Pd content: 32.89 mmol) was introduced thereto. Then, while the same sodium chloride solution as that of the first embodiment was added thereto, the system was stirred. An aqueous solution of PVP (obtained by dissolving 8.75 g of PVP in 1500 mL of pure water) was added to this aqueous solution of Pd chloride, and 875 mL of methanol was added thereto. Thereafter, similarly to the first embodiment, the reaction liquid was heated, stirred and heated to reflux, and Pd particles were collected by concentration, ultrafiltration, and filtration. The Pd particles obtained by this process had an average particle size of 4 nm, and the face-to-face dimension of the (111) plane of Pd was 2.254 Å.

Comparative Example 1

As Comparative Example for the embodiments described above, Pd particles were produced by a conventional method. The Pd particles were produced by means of dinitrodiamine Pd nitrate as a precursor of the Pd particles. 76.67 g of dinitrodiamine Pd nitrate (Pd content: 32.89 mmol) was dissolved in 2000 mL of pure water in relation to the first embodiment. At this time, dinitrodiamine Pd nitrate dissolved easily in water. Thereafter, an aqueous solution of PVP and a reducing agent were added thereto under the same conditions as in the first embodiment, and the mixture was heated to reflux. Thus, Pd particles were collected. The Pd particles at this time had an average particle size of 4 nm, and a face-to-face dimension of the (111) plane of Pd of 2.251 Å.

Comparative Example 2

Similarly to Comparative Example 1, Pd particles were produced by means of dinitrodiamine Pd nitrate as a precursor of the Pd particles. 4.98 g of sodium borohydride was added as a reducing agent in relation to Comparative Example 1. Thereafter, similarly to the first embodiment, the mixture was heated to reflux, and Pd particles were collected. The Pd particles at this time had an average particle size of 15.0 nm, and a face-to-face dimension of the (111) plane of Pd of 2.243 Å.

Evaluation was carried out by performing treatment of substrates by means of the Pd colloidal particles of the third embodiment and Comparative Examples 1 and 2 produced as described above, in the form of colloidal solutions, and performing formation of a Co—W—B film according to electroless plating. Regarding the substrates used, they were 10 kinds of Si substrates in which via holes having a hole diameter of 2 μm and a depth of 6 to 100 μm (aspect ratio: 3 to 50) were formed. Furthermore, SAMs were formed thereon in the same manner as in the first embodiment. Furthermore, the Pd concentration of the colloidal solutions for the treatment of substrates was 0.1 wt %. The conditions for electroless plating of the Co—W—B film were the same as in the second embodiment.

In regard to this evaluation, the adsorption density of the Pd particles at the bottoms of the via holes in the substrates obtained after the treatment with a Pd colloidal solution was measured, and also, the presence or absence of the formation of a continuous metal film inside the via holes after electroless plating was investigated. These results are presented in Table 1. Furthermore, this evaluation test was also carried out for the Pd colloidal solution of the first embodiment.

TABLE 1

| | | First embodiment<br>Average particle size 2.2 nm<br>Face-to-face dimension<br>2.293 Å | | Third embodiment<br>Average particle size 4.0 nm<br>Face-to-face dimension<br>2.254 Å | | Comparative Example 1<br>Average particle size 4.0 nm<br>Face-to-face dimension<br>2.251 Å | | Comparative Example 2<br>Average particle size 15.0 nm<br>Face-to-face dimension<br>2.243 Å | |
|---|---|---|---|---|---|---|---|---|---|
| | | Particle adsorption density | Continuous plated film | Particle adsorption density | Continuous plated film | Particle adsorption density | Continuous plated film | Particle adsorption density | Continuous plated film |
| TSV aspect ratio | 3 | ○ | ○ | ○ | ○ | ○ | ○ | ○ | ○ |
| | 5 | ○ | ○ | ○ | ○ | ○ | ○ | Δ | ○ |
| | 10 | ○ | ○ | ○ | ○ | Δ | ○ | Δ | ○ |
| | 12 | ○ | ○ | ○ | ○ | Δ | ○ | Δ | Δ |
| | 15 | ○ | ○ | ○ | ○ | Δ | ○ | Δ | Δ |
| | 20 | ○ | ○ | ○ | ○ | Δ | Δ | x | Δ |
| | 25 | ○ | ○ | ○ | ○ | x | Δ | x | x |
| | 30 | ○ | ○ | Δ | ○ | x | Δ | x | x |
| | 40 | ○ | ○ | Δ | ○ | x | x | x | x |
| | 50 | ○ | ○ | Δ | ○ | x | x | x | x |

For particle adsorption density
○ . . . 8000 particles/μm$^2$ or more to the bottoms of TSV holes
Δ . . . 4000 to 8000 particles/μm$^2$ to the bottoms of TSV holes
x . . . Fewer than 4000 particles/μm$^2$ to the bottoms of TSV holes
For continuous plated film
○ . . . Continuous film was formed
Δ . . . Continuous film was formed, but via holes or voids were present
x . . . Continuous film was not formed It was confirmed from the results of Table 1 that the colloidal solutions containing Pd particles of the first and third embodiments could adsorb the Pd particles to the bottoms of via holes having a high aspect ratio. Furthermore, also for the formation of a metal film, it was confirmed that continuous films without any defects were formed. On the other hand, regarding the treatment using conventional Pd colloidal solutions in Comparative Examples, it can be said that the treatment was effective for substrates having via holes with a low aspect ratio (3 to 5); however, it can be seen that when the aspect ratio was 40 to 50, the treatment was hardly effective.

Furthermore, in the third embodiment, the aspect ratio of the via holes was 30 or more, and the particle adsorption density was 8000 particles/μm$^2$ or less. In the third embodiment, the target support density for the plating processing was attained, and in this test, there was no hindrance to the formation of a continuous film. Therefore, it can be said that the third embodiment can be applied to most of the use applications. However, for example, in the case of making the target film thickness of the plated film to be very thin, there is a risk of the formation of partial pinholes. In such a case, it is expected that the risk can be coped with by making the particle size of the Pd particles to be finer (for example, 3 nm or less).

INDUSTRIAL APPLICABILITY

As discussed above, according to the present invention, Pd particles having high catalytic activity can be suitably dispersed, and the adhesiveness of the plating layer obtained thereafter can be made satisfactory. The present invention is useful for the plating processing for the formation of planar substrates as well as substrates for TSV having high aspect ratios. Furthermore, the present invention becomes more effective when combined with the formation of organic layers such as SAM.

The invention claimed is:

1. A method for treating a substrate, the method including bringing a substrate into contact with a colloidal solution containing metal particles in order to support the metal particles that serve as a catalyst for forming a plating layer on the substrate,
wherein the colloidal solution contains metal particles formed of Pd and having a particle size of 0.6 nm to 4.0 nm and a face-to-face dimension of a plane 111 of 2.254 Å or more but 2.388 Å or less.

2. The method for treating a substrate according to claim 1, wherein the method comprising a step of forming an organic layer formed from an organic substance, on a surface of the substrate before the contacting with the colloidal solution.

3. The method for treating a substrate according to claim 2, wherein a self-assembled monolayer (SAM) is formed as the organic layer.

4. The method for treating a substrate according to claim 3, wherein the step of forming a self-assembled monolayer is applying a silane coupling agent on the substrate.

5. The method for treating a substrate according to claim 2, wherein a film comprising a polyimide, polyethylene terephthalate, or polyethylene naphthalate is formed as the organic layer.

6. The method for treating a substrate according to claim 1, wherein the concentration of the metal particles in the colloidal solution is adjusted to $9.3 \times 10^{-6}$ to $3.8 \times 10^{-1}$ mol/L.

7. The method for treating a substrate according to claim 1, wherein the substrate is a substrate having one or more via holes formed therein, and at least one aspect ratio of the via holes is 3 to 50.

8. The method for treating a substrate according to claim 2, wherein the step of forming an organic layer is applying a silane coupling agent on the substrate.

9. The method for treating a substrate according to claim 3, wherein a film comprising a polyimide, polyethylene terephthalate, or polyethylene naphthalate is formed as the organic layer.

10. The method for treating a substrate according to claim 4, wherein a film comprising a polyimide, polyethylene terephthalate, or polyethylene naphthalate is formed as the organic layer.

11. The method for treating a substrate according to claim 2, wherein the concentration of the metal particles in the colloidal solution is adjusted to $9.3 \times 10^{-6}$ to $3.8 \times 10^{-1}$ mol/L.

12. The method for treating a substrate according to claim 3, wherein the concentration of the metal particles in the colloidal solution is adjusted to $9.3 \times 10^{-6}$ to $3.8 \times 10^{-1}$ mol/L.

13. The method for treating a substrate according to claim 4, wherein the concentration of the metal particles in the colloidal solution is adjusted to $9.3 \times 10^{-6}$ to $3.8 \times 10^{-1}$ mol/L.

14. The method for treating a substrate according to claim 5, wherein the concentration of the metal particles in the colloidal solution is adjusted to $9.3 \times 10^{-6}$ to $3.8 \times 10^{-1}$ mol/L.

15. The method for treating a substrate according to claim 2, wherein the substrate is a substrate having one or more via holes formed therein, and at least one aspect ratio of the via holes is 3 to 50.

16. The method for treating a substrate according to claim 3, wherein the substrate is a substrate having one or more via holes formed therein, and at least one aspect ratio of the via holes is 3 to 50.

17. The method for treating a substrate according to claim 4, wherein the substrate is a substrate having one or more via holes formed therein, and at least one aspect ratio of the via holes is 3 to 50.

18. The method for treating a substrate according to claim 5, wherein the substrate is a substrate having one or more via holes formed therein, and at least one aspect ratio of the via holes is 3 to 50.

19. The method for treating a substrate according to claim 6, wherein the substrate is a substrate having one or more via holes formed therein, and at least one aspect ratio of the via holes is 3 to 50.

* * * * *